(12) United States Patent
Goh et al.

(10) Patent No.: US 7,567,313 B2
(45) Date of Patent: Jul. 28, 2009

(54) BEZEL DESIGN FOR SURFACE MOUNT DISPLAY MODULES

(75) Inventors: Seng Geap Goh, Penang (MY); Yi Feng Hwang, Perak (MY); Heng Yow Cheng, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 1209 days.

(21) Appl. No.: 10/618,541

(22) Filed: Jul. 10, 2003

(65) Prior Publication Data

US 2005/0006548 A1   Jan. 13, 2005

(51) Int. Cl.
*G02F 1/1333* (2006.01)

(52) U.S. Cl. .................. 349/58; 425/508; 425/112; 425/392; 264/249

(58) Field of Classification Search .............. None
See application file for complete search history.

(56) References Cited

U.S. PATENT DOCUMENTS

| | | | | |
|---|---|---|---|---|
| 4,859,378 | A | * | 8/1989 | Wolcott .................. 264/445 |
| 5,853,383 | A | * | 12/1998 | Murdock .................. 604/20 |
| 6,139,362 | A | * | 10/2000 | Brown ...................... 439/567 |
| 6,298,533 | B1 | * | 10/2001 | Nishimura et al. ......... 29/243.5 |
| 2002/0100363 | A1 | * | 8/2002 | Vatterott et al. ............ 92/85 B |

* cited by examiner

*Primary Examiner*—Richard H Kim

(57) ABSTRACT

Improved electronic display module for surface mount construction. Plastic components are heat-stake mounted to a printed circuit board substrate. Providing recesses for the reflowed plastic heat stakes reduces or eliminates rework required to provide flat surface needed for surface mounting.

17 Claims, 3 Drawing Sheets

BEZEL DESIGN FOR SURFACE MOUNT DISPLAY MODULES

BACKGROUND OF THE INVENTION

1. Field of the Invention

The present invention pertains to the art of electronic display modules, and more particularly, to the attachment of components such as bezels and reflectors relying upon heat staking to surface mount display modules.

2. Art Background

Electronic displays are used in a variety of devices to display information to the user. A variety of technologies are used, including Liquid Crystal Displays (LCD), Vacuum Fluorescent Displays (VFD), and Light Emitting Diode displays (LED).

With the development of brighter and more colorful LED materials, LED displays are becoming more popular.

These displays are typically produced as subassemblies or components for inclusion in more complex devices. A display is typically manufactured on a small printed circuit board which contains the display material, LED, LCD, or VFD. It is often desirable to mount a plastic component such as a bezel or reflector to the display circuit board to shape or improve the display. A bezel serves a number of purposes, from protecting the display elements to directing and diffusing light from elements such as LEDs, adding legends or descriptive information, and the like. The bezel is typically made from a plastic or thermoplastic material, and is attached to the display circuit board by heat staking a plurality of mounting stakes from the bezel through mounting holes on the display circuit board. Similarly, and particularly for LED displays, a reflector may also be used to diffuse and couple light from LED chips mounted to the display circuit board. This reflector is typically mounted to the display circuit board by heat staking.

The process of heat staking involves passing a plastic member called a stake through a mounting hole in the display circuit board. The stake is heated, deforming the plastic material to cover part of the surrounding display circuit board, securing the stake in place.

The completed display circuit board must be connected to the larger electronic assembly. One approach is to provide a connector on the display circuit board, allowing connections to be made to the larger assembly. Another approach is to provide connecting pins or a leadframe base on the display circuit board, providing it with leads similar to those used in integrated circuit packages. Neither of these approaches is desirable, as they add cost and complexity to not only the display module, but also to the overall device.

Many electronic devices manufactured today use surface-mount techniques, where components are mounted and soldered in place on the surface of a circuit board.

It is desirable to treat display modules as surface-mountable components. Doing so allows the use of automated assembly equipment, reducing manufacturing time and cost. To be suitable for surface mount, the bottom surface of the display module must be precisely planar. Irregularities in the bottom surface of the display module introduce soldering problems when mounting the display module to the larger device, such as poor wetting, open connections, solder bridging, and solder joint deformation.

Unfortunately, heat staking produces irregularities in the lumps of thermoplastic formed during the heat staking process. These irregularities must be reworked to make the display circuit board suitable for use in a surface-mount environment. This rework is not only time consuming and therefore costly, but if significant material is removed, the holding strength provided by the stake is weakened considerably.

SUMMARY OF THE INVENTION

An improved electronic display module suitable for surface mounting features recesses in the display circuit board for containing reflowed plastic material resulting from heat staking the mounting stakes from a plastic component such as a bezel or reflector.

BRIEF DESCRIPTION OF THE DRAWINGS

The present invention is described with respect to particular exemplary embodiments thereof and reference is made to the drawings in which.

DETAILED DESCRIPTION

Figure 1:
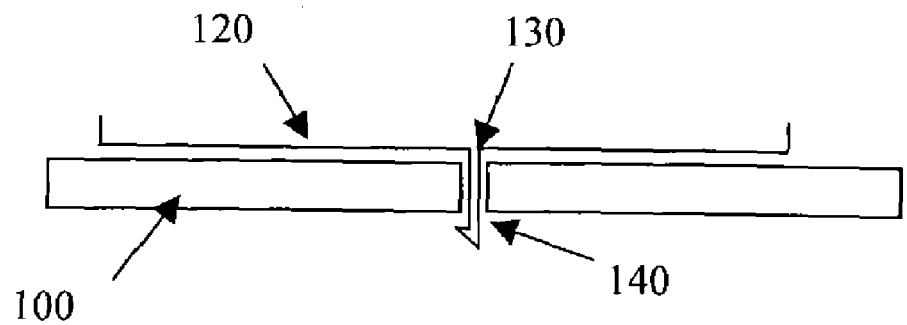
FIG. 1 shows a side view of a printed circuit board with stakes.

FIG. 1 shows a side view of a printed circuit board 100. For clarity, conductive traces on the top and bottom of the board are not shown. Plastic element 120, such as a reflector or bezel, mounts to circuit board 100 by means of stake 130 through hole 140 in circuit board 100. As shown in FIG. 1, stake 130 is barbed as an aid to assembly; they may also be straight, or have tapered tips to facilitate assembly.

Figure 2:
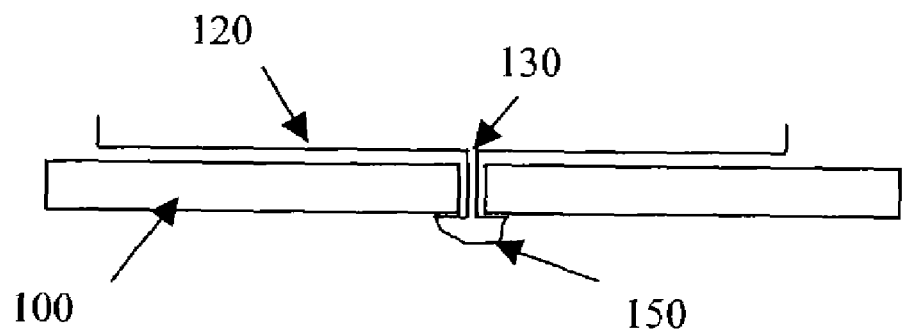
FIG. 2 shows a side view of a printed circuit board with reformed stakes.

As shown in FIG. 2, the end of stake 130 is heated and reformed, leaving lump 150 securing component 120 in place. The height and nonuniformity of these lumps precludes the use of printed circuit board 100 in a surface mount environment without rework to remove lump 150.

Figure 3:
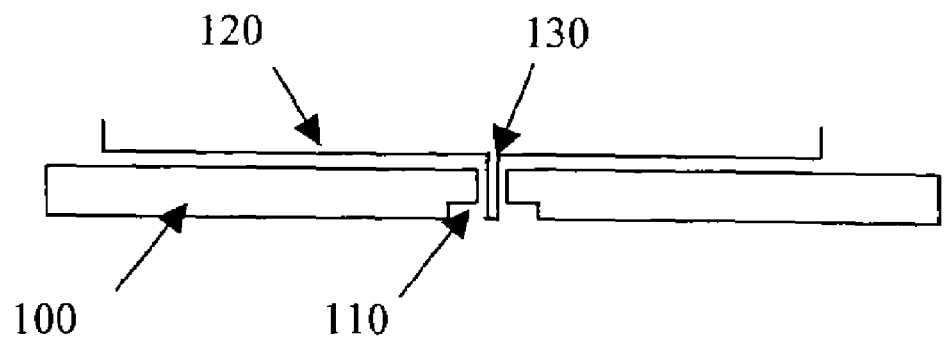
FIG. 3 shows a side view of a printed wiring board according to the present invention.
Figure 4:
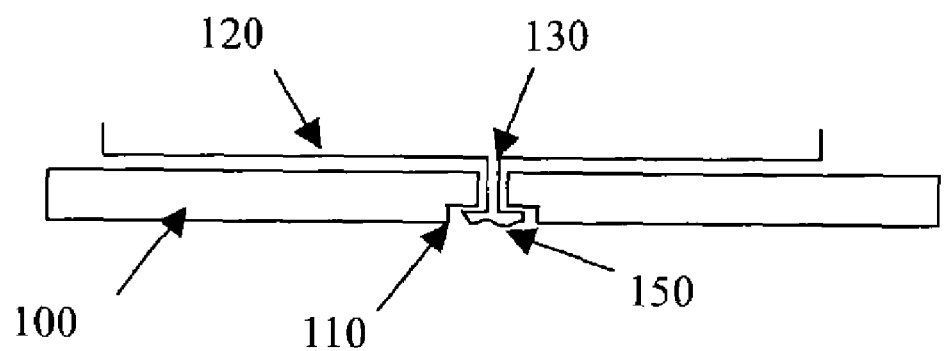
FIG. 4 shows a side view of a printed wiring board with reformed stakes.

FIG. 3 shows a printed circuit board according to the present invention. In one embodiment of the invention, printed circuit board 100 has recess 110 for stake 130. As shown in FIG. 4, when stake 130 is reformed, lump 150 is contained within recess 110, leaving the bottom surface of printed circuit board 100 flat, reducing or eliminating the need for rework.

Figure 5:
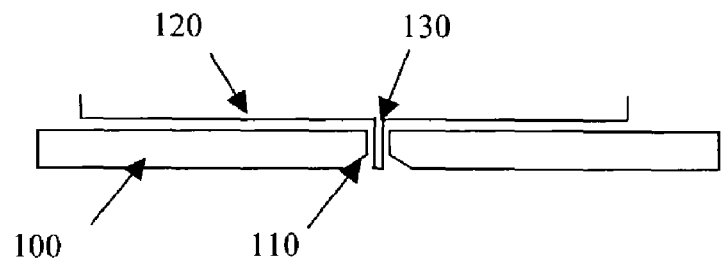
FIGS. 5, 6, and 7 show additional embodiments of the invention.
Figure 6:
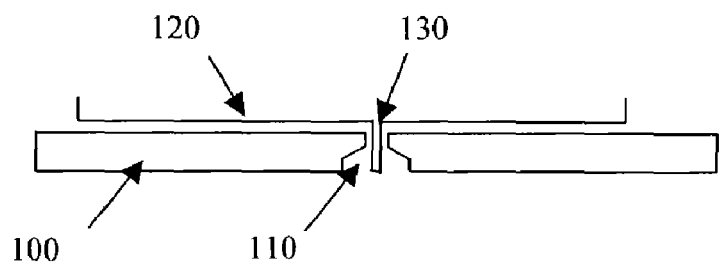
Figure 7:
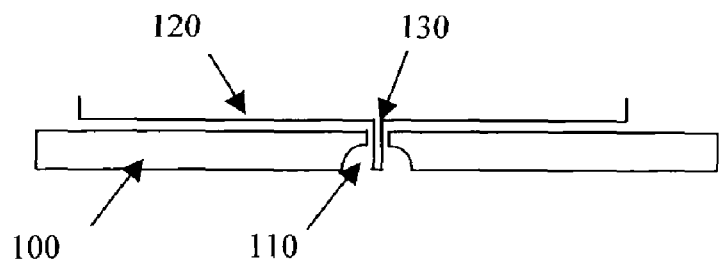

It is important that recess 110 be able to contain heat stake lump 150. For this reason, a thicker printed circuit board substrate material must be used, on the order of 1.6 mm, or thick enough so that recess 110 is able to contain the volume of heat stake lump 150.

Where FIG. 4 shows recess 110 as having a stepped cross section, FIG. 5 shows an additional embodiment in which recess 110 is V-shaped. FIG. 6 shows an additional embodiment with straight sides and a V-shaped bottom. FIG. 7 shows an additional embodiment which is U-shaped.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. A module, comprising:
   a substrate having a first side and a second side, the substrate defining one or more holes from the first side to the second side, the substrate additionally defining a recess located about the hole on the second side; and
   a plastic member for mounting to the first side of the substrate, the plastic member comprising a thermoplastic heat stake having a barbed tip selected such that when reformed using heat, the thermoplastic material of the barbed tip forms a lump that is confined inside the recess of the substrate.

2. The module of claim 1, wherein the substrate is a printed circuit board (PCB) and the second side of the PCB is substantially planar for configuring the module as a surface mount module.

3. The module of claim 1, wherein the recess is a V-shaped recess.

4. The module of claim 1, wherein the recess is a U-shaped recess.

5. The module of claim 1, wherein the recess comprises a first portion having straight sides and a second portion that is V-shaped.

6. The module of claim 1, wherein the recess has a stepped cross section.

7. A method of forming a surface mount module, the method comprising:
   providing a substrate having a first side and a second side;
   providing a hole in the substrate from the first side to the second side;
   providing a recess about the hole on the second side;
   providing a plastic member having a thermoplastic heat stake;
   mounting the plastic member on the first side of the substrate, the mounting comprising insertion of the thermoplastic heat stake into the hole in the substrate; and
   heating a barbed tip of the thermoplastic heat stake whereby the thermoplastic material of the barbed tip is melted and confined inside the recess of the substrate.

8. The method of claim 7, further comprising:
   mounting the surface mount module upon a printed circuit board (PCB) using surface mounting techniques.

9. The method of claim 7, wherein the barbed tip is selected to have a volume whereby when heated the thermoplastic material of the barbed tip is deformed and confined inside the recess of the substrate.

10. A module, comprising:
    a substrate having a mounting hole extending from a first surface to a second surface, the mounting hole further defined by a recess located in the second surface; and
    a component that is mountable upon the first surface of the substrate, the component comprising a thermoplastic heat stake configured for insertion into the mounting hole in the substrate, the thermoplastic heat stake having a barbed tip with a material volume that is selected for deforming under heat to produce a lump that is located, at least in part, inside the recess and is operative to securing the component to the substrate.

11. The module of claim 10, wherein the material volume is selected such that the lump is wholly confined inside the recess without requiring removal of a portion of the material after application of the heat.

12. The module of claim 11, wherein the second surface is substantially planar so as to provide surface mounting capability to the module.

13. The module of claim 12, wherein the substrate and the component are parts of an electronic display.

14. The module of claim 13, wherein the component is at least one of a) a light diffusing element or b) a reflector for reflecting light from a light source mounted on the substrate.

15. The module of claim 14, wherein the light diffusing element is a plastic light diffusing element.

16. The module of claim 13, wherein the substrate is a printed circuit board (PCB).

17. The module of claim 16, wherein the PCB has a thickness approximately 1.6mm.

* * * * *

UNITED STATES PATENT AND TRADEMARK OFFICE
CERTIFICATE OF CORRECTION

PATENT NO. : 7,567,313 B2  
APPLICATION NO. : 10/618541  
DATED : July 28, 2009  
INVENTOR(S) : Seng Geap Goh et al.

Page 1 of 1

It is certified that error appears in the above-identified patent and that said Letters Patent is hereby corrected as shown below:

Column 4, Line 29, Claim 14, delete "claim 13," and insert --claim 10,--.

Column 4, Line 34, Claim 16, delete "claim 13," and insert --claim 10,--.

Signed and Sealed this  
Twenty-fifth Day of September, 2012

David J. Kappos  
*Director of the United States Patent and Trademark Office*